(12) United States Patent
Lee et al.

(10) Patent No.: US 7,176,070 B2
(45) Date of Patent: Feb. 13, 2007

(54) ACTIVE MATRIX ORGANIC LIGHT EMITTING DISPLAY AND METHOD OF FORMING THE SAME

(75) Inventors: Hsin-Hung Lee, Taipei (TW); Chih-Feng Sung, Miaoli (TW)

(73) Assignee: AU Optronics Corp., Hsinchu (TW)

( * ) Notice: Subject to any disclaimer, the term of this patent is extended or adjusted under 35 U.S.C. 154(b) by 92 days.

(21) Appl. No.: 10/869,250

(22) Filed: Jun. 15, 2004

(65) Prior Publication Data

US 2004/0232420 A1 Nov. 25, 2004

Related U.S. Application Data

(62) Division of application No. 10/339,009, filed on Jan. 8, 2003, now Pat. No. 6,784,032.

(30) Foreign Application Priority Data

May 1, 2002 (TW) .............................. 91109072 A

(51) Int. Cl.
*H01L 21/00* (2006.01)

(52) U.S. Cl. .................. 438/149; 438/82; 438/237; 438/116; 257/443; 257/294; 257/E31.122

(58) Field of Classification Search ................ 438/149, 438/82, 237, 116; 257/443, 294, E31.122
See application file for complete search history.

(56) References Cited

U.S. PATENT DOCUMENTS

| 6,351,078 | B1 * | 2/2002 | Wang et al. | 315/169.3 |
| 6,489,631 | B2 | 12/2002 | Young et al. | 257/59 |
| 6,515,428 | B1 * | 2/2003 | Yeh et al. | 315/169.3 |
| 6,661,180 | B2 | 12/2003 | Koyama | 315/169.3 |
| 2002/0117963 | A1 * | 8/2002 | Chuman et al. | 313/504 |
| 2003/0179323 | A1 * | 9/2003 | Abileah et al. | 349/24 |

\* cited by examiner

*Primary Examiner*—Michelle Estrada
*Assistant Examiner*—Nicholas J. Tobergte
(74) *Attorney, Agent, or Firm*—Ladas & Parry LLP

(57) ABSTRACT

An active matrix organic light emitting display (AM-OLED) and a method of forming the same. The AM-OLED has a plurality of pixel areas arranged in a matrix form. Each pixel area has at least two amorphous silicon TFTs, a display area and a light-shielding layer. The amorphous silicon TFT has an amorphous silicon layer serving as a channel region. The display area is formed by a transparent-conductive layer. The light-shielding layer covers at least the amorphous silicon layer of the amorphous silicon TFT and exposes the display area.

8 Claims, 16 Drawing Sheets

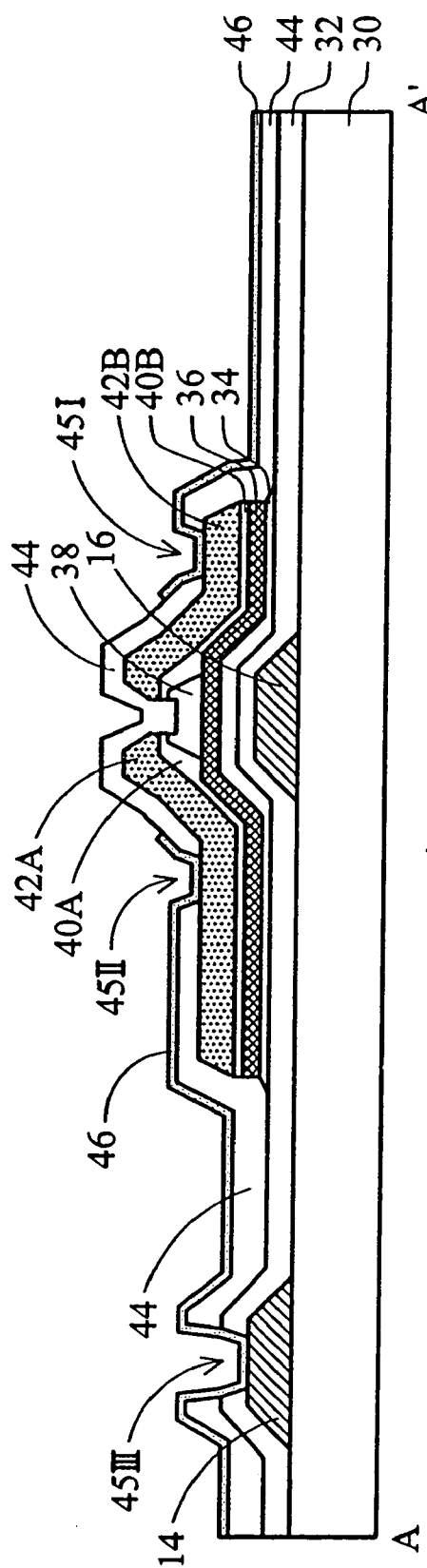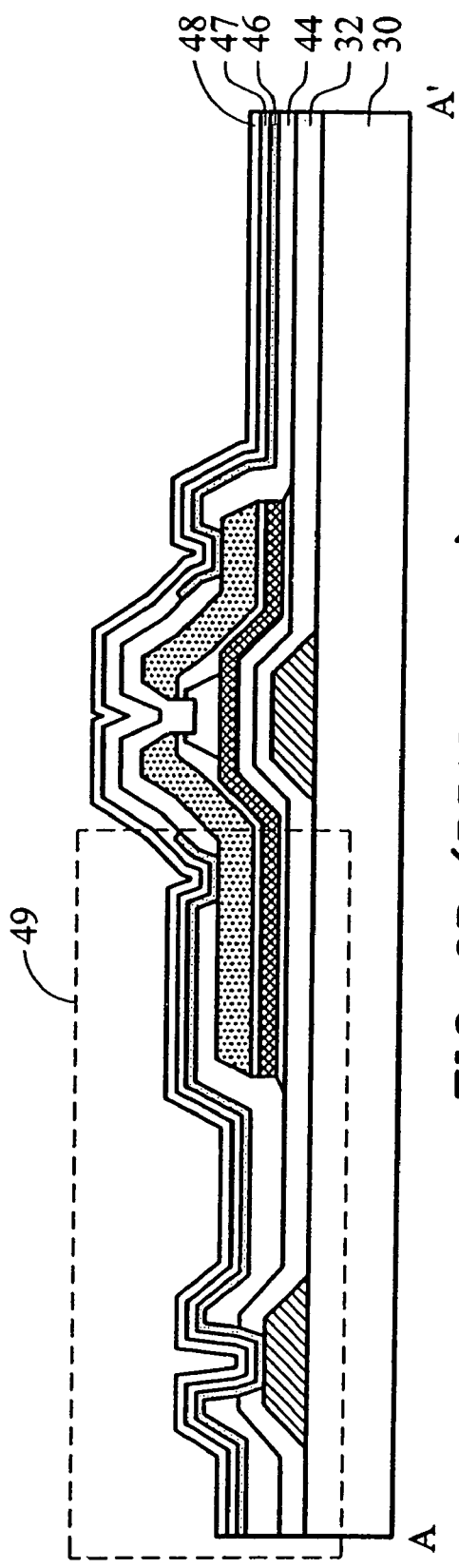
FIG. 2A (PRIOR ART)
FIG. 2B (PRIOR ART)

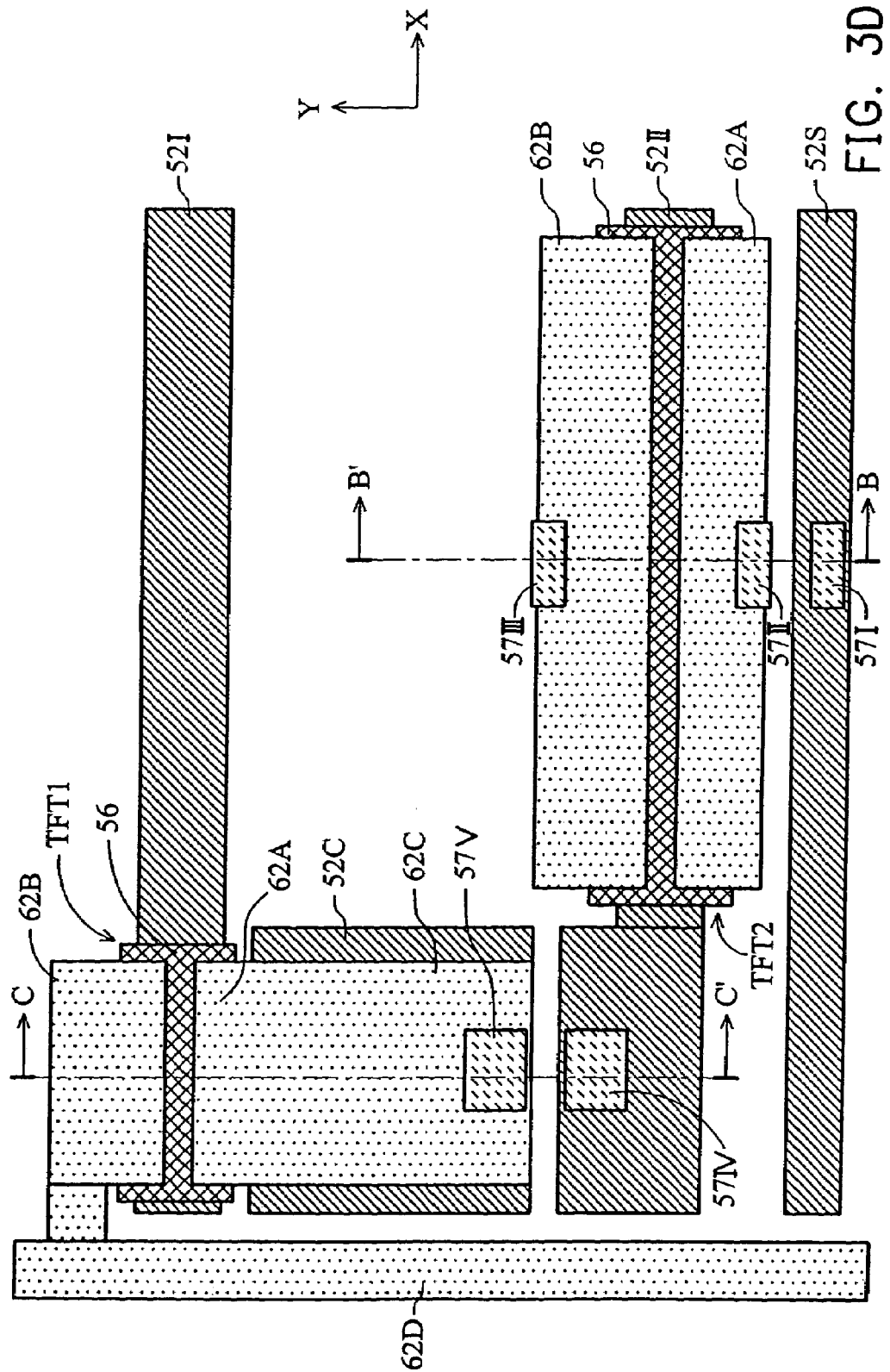

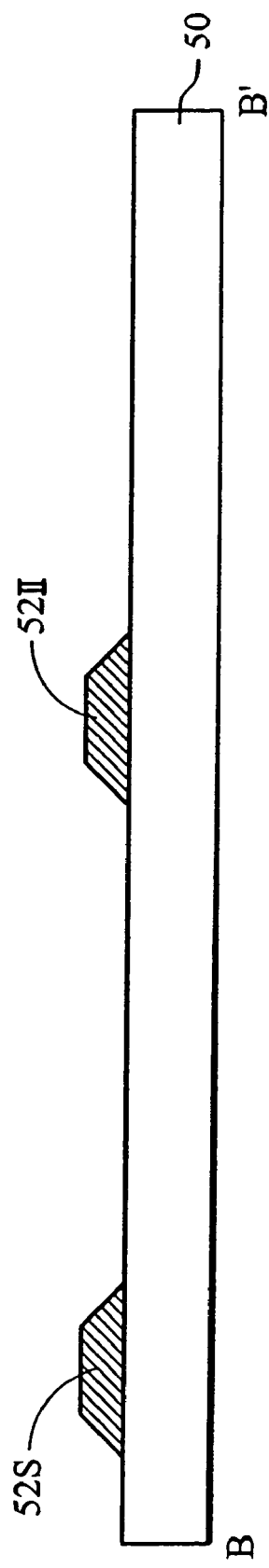
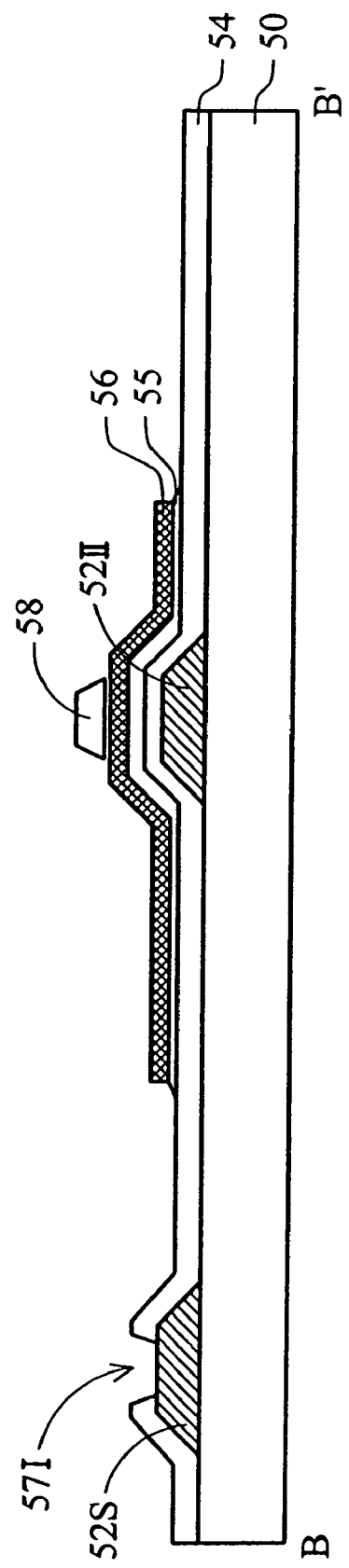

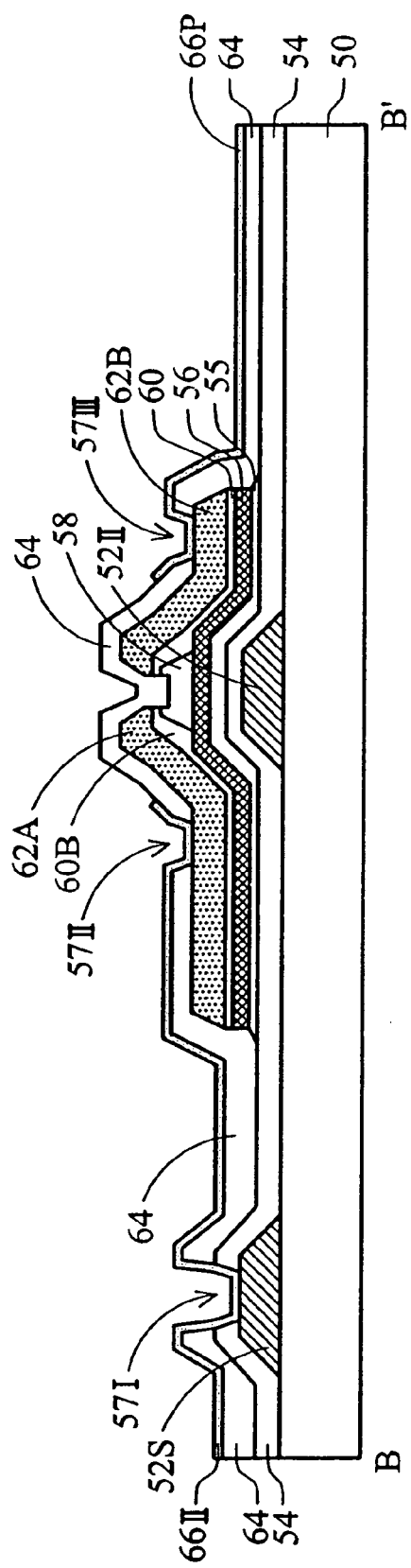
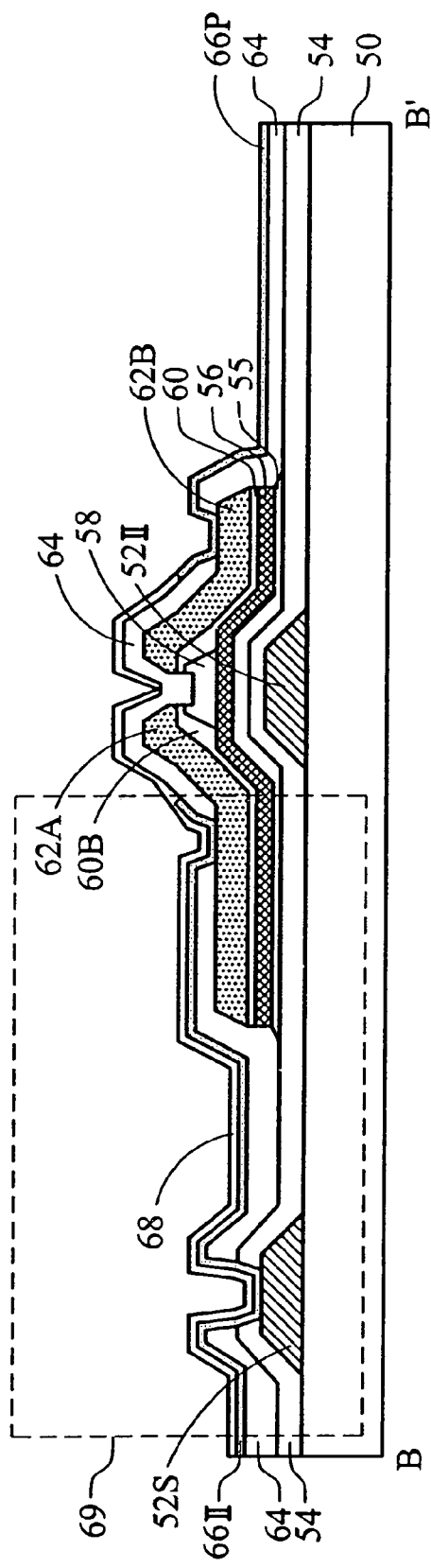
FIG. 4E
FIG. 4F

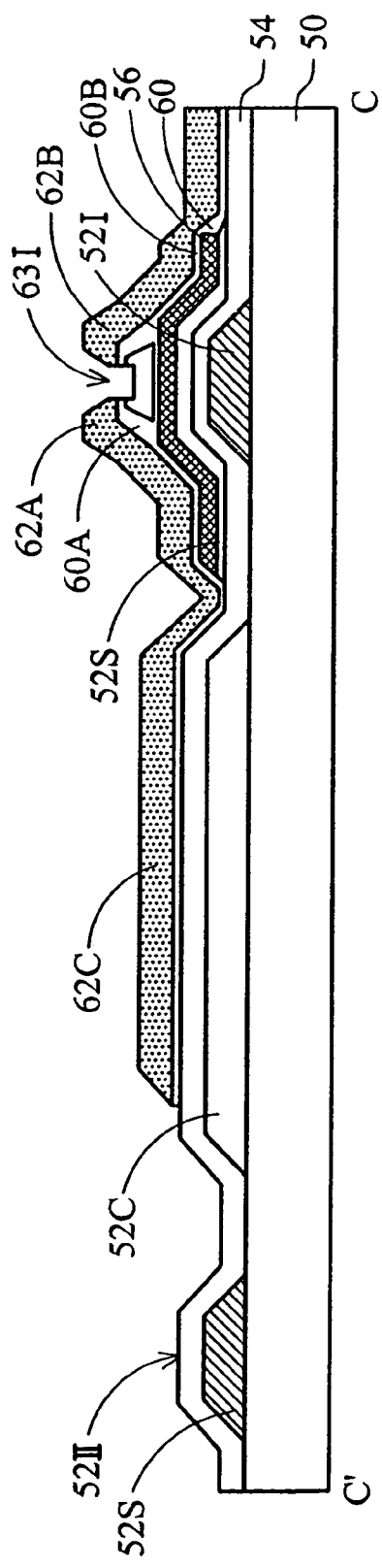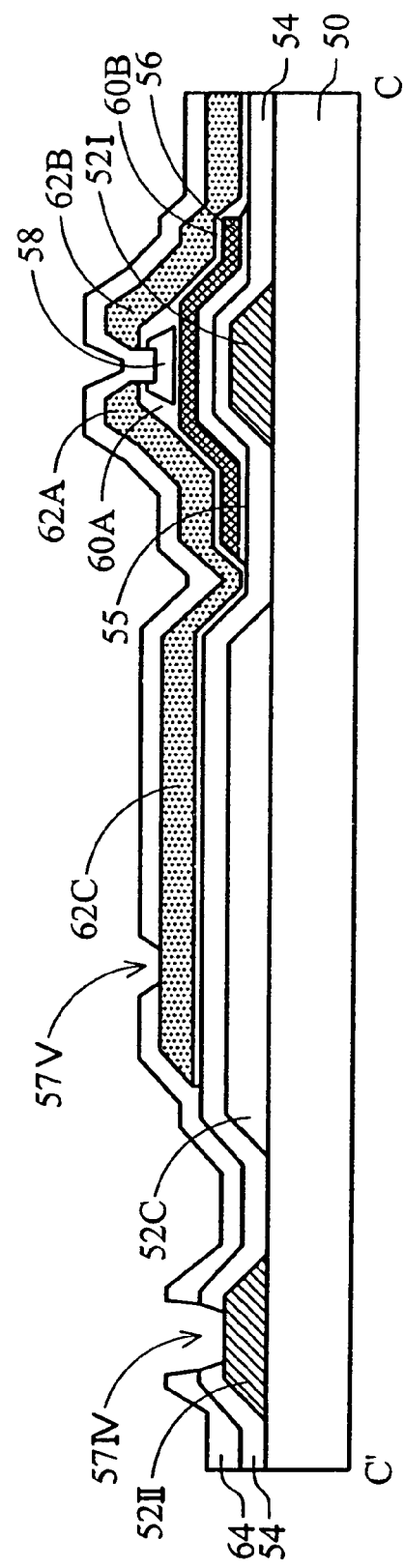

ACTIVE MATRIX ORGANIC LIGHT EMITTING DISPLAY AND METHOD OF FORMING THE SAME

CROSS-REFERENCE TO RELATED APPLICATIONS

This patent application is a divisional application of U.S. Ser. No. 10/339,009, filed on Jan. 8, 2003 now U.S. Pat. No. 6,784,032, which claims priority to Taiwanese Application No. 91109072, filed on May 1, 2002.

BACKGROUND OF THE INVENTION

1. Field of the Invention

The present invention relates to an active matrix organic light emitting display (AM-OLED) with an amorphous silicon thin film transistor (a-Si:H TFT) as a driving device and, more particularly, to an AM-OLED with a light-shielding structure that isolates parasitic OLEDs outside a display area and prevents damage to an amorphous silicon layer from subsequent surface treatments.

2. Description of the Related Art

In accordance with driving methods, an organic light emitting display (OLED) can be an active matrix type or a positive matrix type. The active matrix organic light emitting display (AM-OLED) is driven by electric currents, in which each of the matrix-array pixel areas has at least one thin film transistor (TFT), serving as a switch, to modulate the driving current based on the variation of capacitor storage potential so as to control the brightness and gray level of the pixel areas. At present, the AM-OLED is driven by two TFTs in each pixel area, and, alternatively, the AM-OLED is driven by four TFTs in each pixel area.

Concerned with the luminescent principle of the AM-OLED, an electric current is applied to a specific organic lamination to change electricity into luminescence. The AM-OLED has panel luminescence with thin-type and light-weight characteristics, spontaneous luminescence with high luminescent efficiency and low driving voltage, and advantages of view angle, high contrast, high-response speed, full color and flexibility. As for the fabrication of the TFTs in the AM-OLED, an amorphous silicon (a-Si:H) TFT process that has been popularly applied to the fabrication of large-size liquid crystal displays (LCDs) is integrated into the AM-OLED process.

Use of two a-Si:H TFTs in each pixel area is an example to describe the conventional a-Si:H TFT process. FIG. 1 is a top view showing an a-Si:H TFT of an AM-OLED according to prior art. The AM-OLED comprises a plurality of pixel areas 10 arranged in a matrix form that are constituted by a plurality of data lines 12 extending along a Y direction and a plurality of source lines (also called $V_{dd}$ lines) 14 extending along an X direction. Also, each pixel area 10 comprises two scanning lines 16 extending along the X direction, two a-Si:H TFTs 18 respectively disposed over the two scanning lines 16, a pixel electrode 20 of rectangular-shaped transparent conductive material disposed between the two scanning lines 16, and a capacitor 22.

In general, the a-Si:H TFT process can be an etching stopper type and a back channel type. Hereinafter, use of the etching stopper type is an example to describe the a-Si:H TFT process of the prior art. FIG. 2A is a sectional diagram along line A–A' of FIG. 1 to show the a-Si:H TFT 18. First, a first metal layer is deposited on a transparent substrate 30 and then patterned as the source line 14, the scanning line 16 and a bottom electrode of the capacitor 22. Next, a first insulating layer 32, a second insulating layer 34 and an a-Si:H layer 36 are successively deposited on the entire surface of the transparent substrate 30. Then, using photolithography and etching to remove parts of the second insulating layer 34 and the a-Si:H layer 36, an island structure is patterned over the predetermined area of the a-Si:H TFT 18. Also, the second insulating layer 34 and the a-Si:H layer 36 disposed over the source line 14 are completely removed. Thereafter, an etch stopper 38 is formed on the island structure over the predetermined area of a gate electrode. After a doped amorphous silicon layer 40 and a second metal layer 42 are successively deposited on the entire surface of the transparent substrate 30, photolithography and etching are used to remove pars of the doped amorphous silicon layer 40 and the second metal layer 42, thus the second metal layer 42 is patterned as the data line 12 and an upper electrode of the capacitor 22. It is noted that the doped amorphous silicon layer 40 and the second metal layer 42 disposed on the island structure remain, and the doped amorphous silicon layer 40 and the second metal layer 42 disposed on the source line 14 are completely removed. Next, using photolithography and etching to form an opening on the island structure over the predetermined area of a gate electrode, the second metal layer 42 is separated as source/drain electrodes 42A and 42B and the doped amorphous silicon layer 40 is separated as source/drain diffusion regions 40A and 40B. Thus, the amorphous silicon layer 36 serves as a channel region.

Next, a protection layer 44 is deposited on the entire surface of the transparent substrate 30 and then patterned to form at least a first via 45I, a second via 45II and a third via 45III. The first via 45I and the second via 45II respectively expose parts of the source/drain electrodes 42A and 42B. The third via 45III passes through the first insulating layer 32 to expose a part of the source line 14. Finally, a transparent-conductive ITO layer 46 is deposited and patterned on the entire surface of the transparent substrate 30 to serve as the rectangular-shaped pixel electrode 20. Also, the ITO layer 46 covers the exposed areas of the first via 45I, the second via 45II and the third via 45III to provide electrical connections.

FIG. 2B is a sectional diagram along line A–A' of FIG. 1 to show a parasitic OLED according to the prior art. When the above-described a-Si:H TFT process is completed, a surface treatment is required before the vapor deposition of a organic/polymer luminescent layer 47 and a cathode metal layer 48. However, the surface treatment normally employs a rinsing process with UV/$O_3$ light or $O_2$ plasma that damages the amorphous silicon layer 36, causing an increased threshold voltage or leakage current. To solve this problem, for the ordinary TFT-LCD process, an annealing treatment additionally applied to the amorphous silicon layer 36 can restore the damaged surface. Nevertheless, for the a-Si:H TFT process, because of the limitation of the subsequent vapor deposition of a organic/polymer luminescent layer 47, it is impossible to use the annealing treatment to restore the damaged surface.

In addition, with regard to the conventional five-mask a-Si:H TFT process, the ITO layer 46 not only serves as the pixel electrode 20, but also serves as an electrical bridge between the second metal layer and the second metal layer or between the second metal layer and the first metal layer. Thus, the ITO layer 46 outside the pixel electrode 20 forms a parasitic OLED area 49 that provides luminescence causing unnecessary power consumption and visual interference.

SUMMARY OF THE INVENTION

The present invention provides an AM-OLED with an a-Si:H TFT as a driving device and, more particularly, in which a light-shielding structure electrically isolates parasitic OLEDs outside a display area and prevents damage to an amorphous silicon layer from subsequent surface treatments.

The active matrix organic light emitting display (AM-OLED) has a plurality of pixel areas arranged in a matrix form. Each pixel area has at least two amorphous silicon TFTs, a display area and a light-shielding layer. The amorphous silicon TFT has an amorphous silicon layer serving as a channel region. The display area is formed by a transparent-conductive layer. The light-shielding layer covers at least the amorphous silicon layer of the amorphous silicon TFT and exposes the display area.

For a method of forming the AM-OLED, a first metal layer is formed on a transparent substrate and then patterned as a first scanning line extending along a X direction, a second scanning line extending along the X direction and an bottom electrode of a capacitor, wherein the bottom electrode of the capacitor is between the two scanning lines. Next, a first insulating layer is formed on the entire surface of the transparent substrate. Next, an island structure is formed on a predetermined TFT area over the first scanning line, wherein the island structure comprises a second insulating layer deposited on the first insulating layer and an amorphous silicon layer deposited on the second insulating layer. Then, an etching stopper is formed on the top of the island structure to cover a predetermined gate electrode of the predetermined TFT. Thereafter, a doped amorphous silicon layer and a second metal layer are formed on the island structure in sequence. Then, the second metal layer is patterned as a data line extending in a Y direction and an upper electrode of the capacitor, and an opening is formed on the island structure to separate the second metal layer as a source/drain electrode and separate the doped amorphous silicon layer as a source/drain diffusion region. Next, a protection layer is formed on the entire surface of the transparent substrate, and a first via and a second via are formed to expose one end of the second scanning line and one end of the upper electrode of the capacitor. Thereafter, a transparent-conductive layer is formed on the entire surface of the transparent substrate, and then patterned as a display area and two electrical-connecting areas that cover the exposed areas of the first via and the second via. Finally, a light-shielding layer is formed on the entire surface of the transparent substrate, wherein the light-shielding layer covers at least the amorphous silicon layer of the predetermined TFT and exposes the display area.

Accordingly, it is a principal object of the invention to provide the light-shielding layer to prevent damage to the amorphous silicon layer 56 from the UV light or plasma in the sequential rinsing process.

It is another object of the invention to decrease the threshold voltage and the leakage current caused by the damage to the amorphous silicon layer.

Yet another object of the invention is to provide a light-shielding layer to isolate the parasitic OLED area.

It is a further object of the invention to prevent unnecessary power consumption and visual interference caused by the luminescence of the parasitic OLED.

These and other objects of the present invention will become readily apparent upon further review of the following specification and drawings.

BRIEF DESCRIPTION OF THE DRAWINGS

FIG. 2A is a sectional diagram along line A–A' of FIG. 1 to show the a-Si:H TFT.

FIG. 2B is a sectional diagram along line A–A' of FIG. 1 to show a parasitic OLED according to the prior art.

FIGS. 3A to 3F are top views showing the a-Si:H TFT process according to the present invention.

FIGS. 4A to 4G are sectional diagrams along line B–B' of FIG. 3 to show the a-Si:H TFT process according to the present invention.

FIGS. 5A to 5G are sectional diagrams along line C–C' of FIG. 3 to show the a-Si:H TFT process according to the present invention.

Similar reference characters denote corresponding features consistently throughout the attached drawings.

DETAILED DESCRIPTION OF THE INVENTION

The present invention provide an AM-OLED with an a-Si:H TFT as a driving device and, more particularly, in which a light-shielding structure electrically isolates parasitic OLEDs outside a display area and prevents damage to an amorphous silicon layer from subsequent surface treatments.

Use of two a-Si:H TFTs in each pixel area is an example to describe the a-Si:H TFT process of the present invention. The AM-OLED comprises a plurality of pixel areas arranged in a matrix form that are constituted by a plurality of data lines extending along a Y direction and a plurality of source lines (also called $V_{dd}$ lines) extending along an X direction. Also, each pixel area comprises two scanning lines extending along the X direction, two a-Si:H TFTs respectively disposed over the two scanning lines, a pixel electrode of rectangular-shaped transparent conductive material disposed between the two scanning lines, and a capacitor.

In general, the a-Si:H TFT process can be an etching stopper type or a back channel type. Hereinafter, use of the etching stopper type is an example to describe the a-Si:H TFT process of the present invention.

FIGS. 3A to 3F are top views showing the a-Si:H TFT process according to the present invention. FIGS. 4A to 4G are sectional diagrams along line B–B' of FIG. 3 to show the a-Si:H TFT process according to the present invention. FIGS. 5A to 5G are sectional diagrams along line C–C' of FIG. 3 to show the a-Si:H TFT process according to the present invention.

Figure 1:
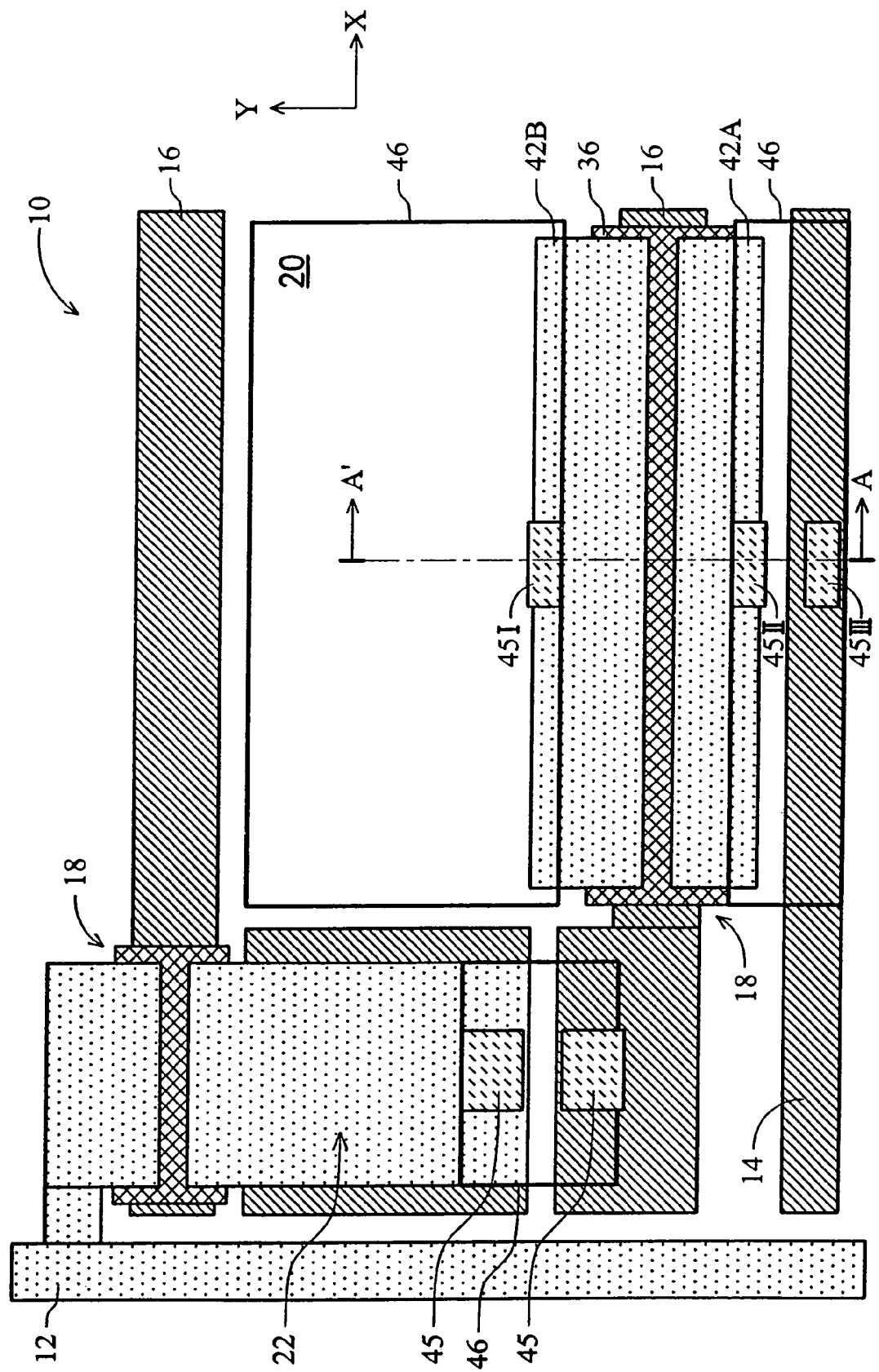
FIG. 1 is a top view showing an a-Si:H TFT of an AM-OLED according to prior art.
Figure 3A:
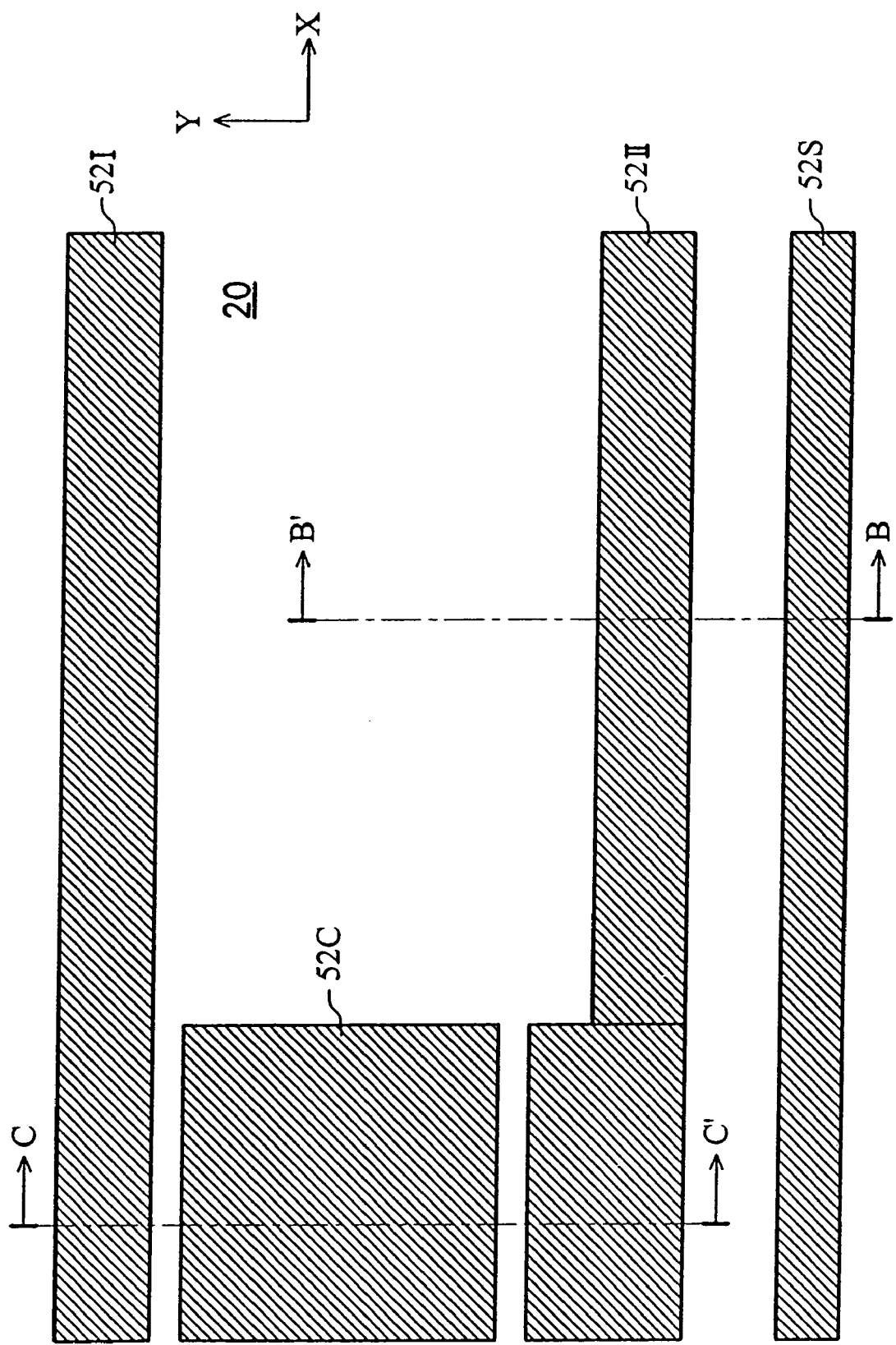
Figure 3B:
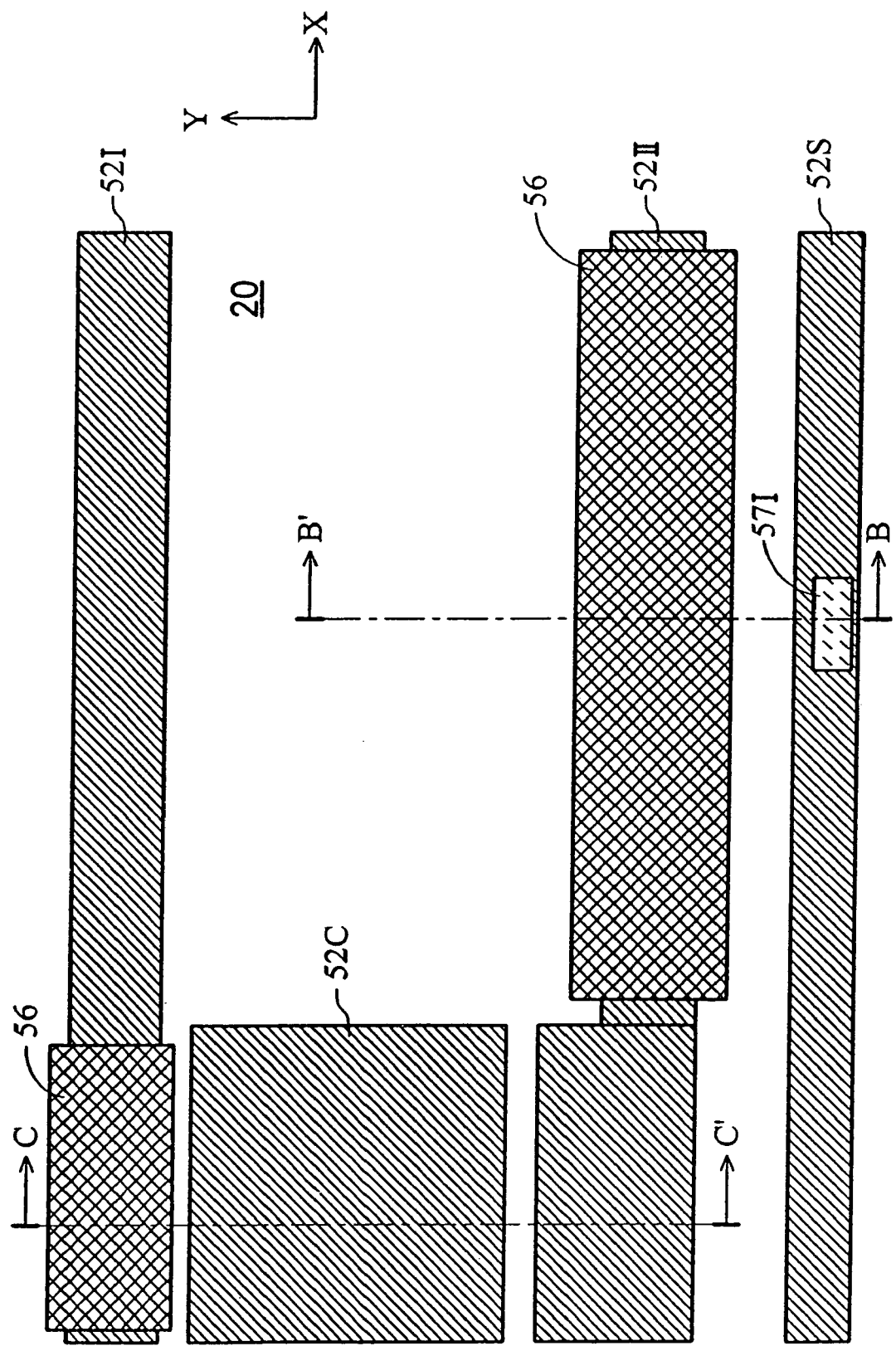
Figure 4C:
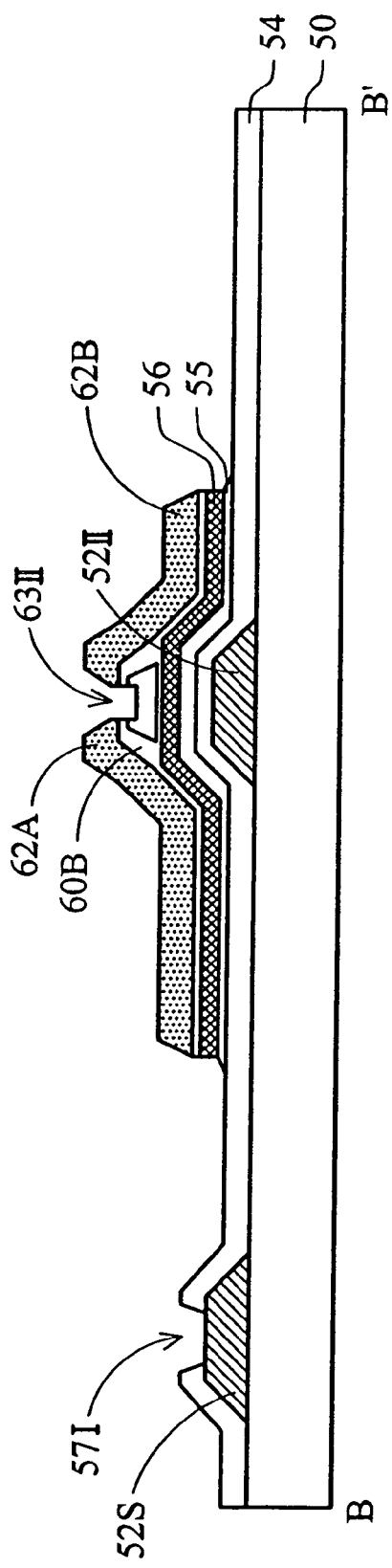
Figure 5A:
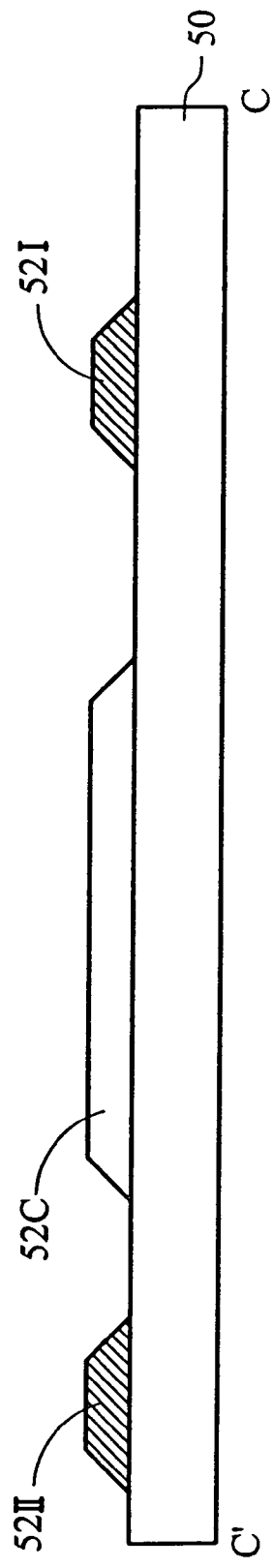
Figure 5B:
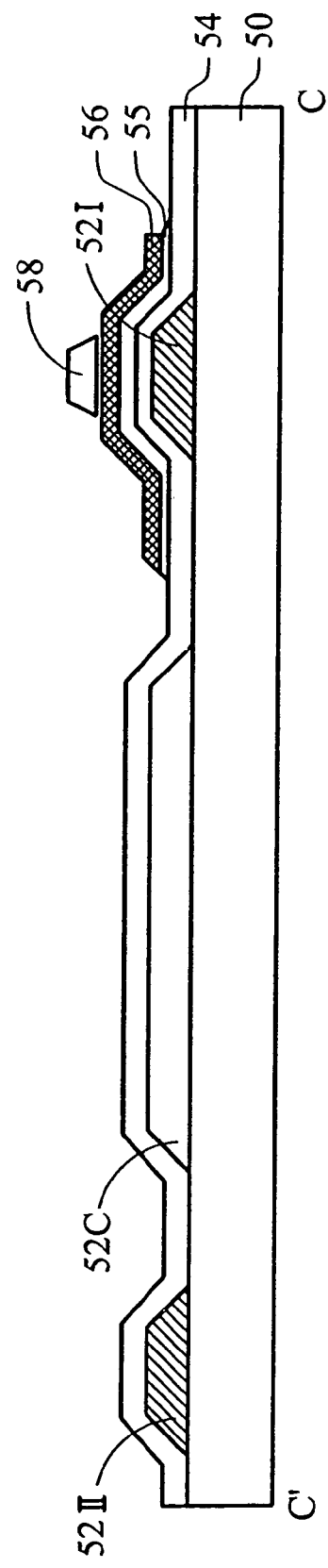

As shown in FIGS. 3A, 4A and 5A, a first metal layer 52 is deposited on a transparent substrate 50 and then patterned as a source line 52S extending along the X direction, a first scanning line 52I extending along the X direction, a second scanning line 52II extending along the X direction, and a bottom electrode 52C of a capacitor. Next, as shown in FIGS. 3B, 4B and 5B, a first insulating layer 54, a second insulating layer 55 and an amorphous silicon layer 56 are successively deposited on the entire surface of the transparent substrate 50. Preferably, the first insulating layer 54 is $SiO_2$, SiN or SiON, and the second insulating layer 55 is $SiO_2$, SiN or SiON. Then, using photolithography and etching to remove parts of the second insulating layer 55 and the amorphous silicon layer 56, two island structures are respectively formed on the predetermined areas of the two a-Si:H TFTs over the two scanning lines 52I and 52II. Also, over the source line 52S, the second insulating layer 55 and the amorphous silicon layer 56 are completely removed and a first via 57I is formed in the first insulating layer 54 to expose a part of the source line 52S. Thereafter, an etching stopper 58 is formed on the predetermined area of the gate electrode within the island structure.

Figure 3C:
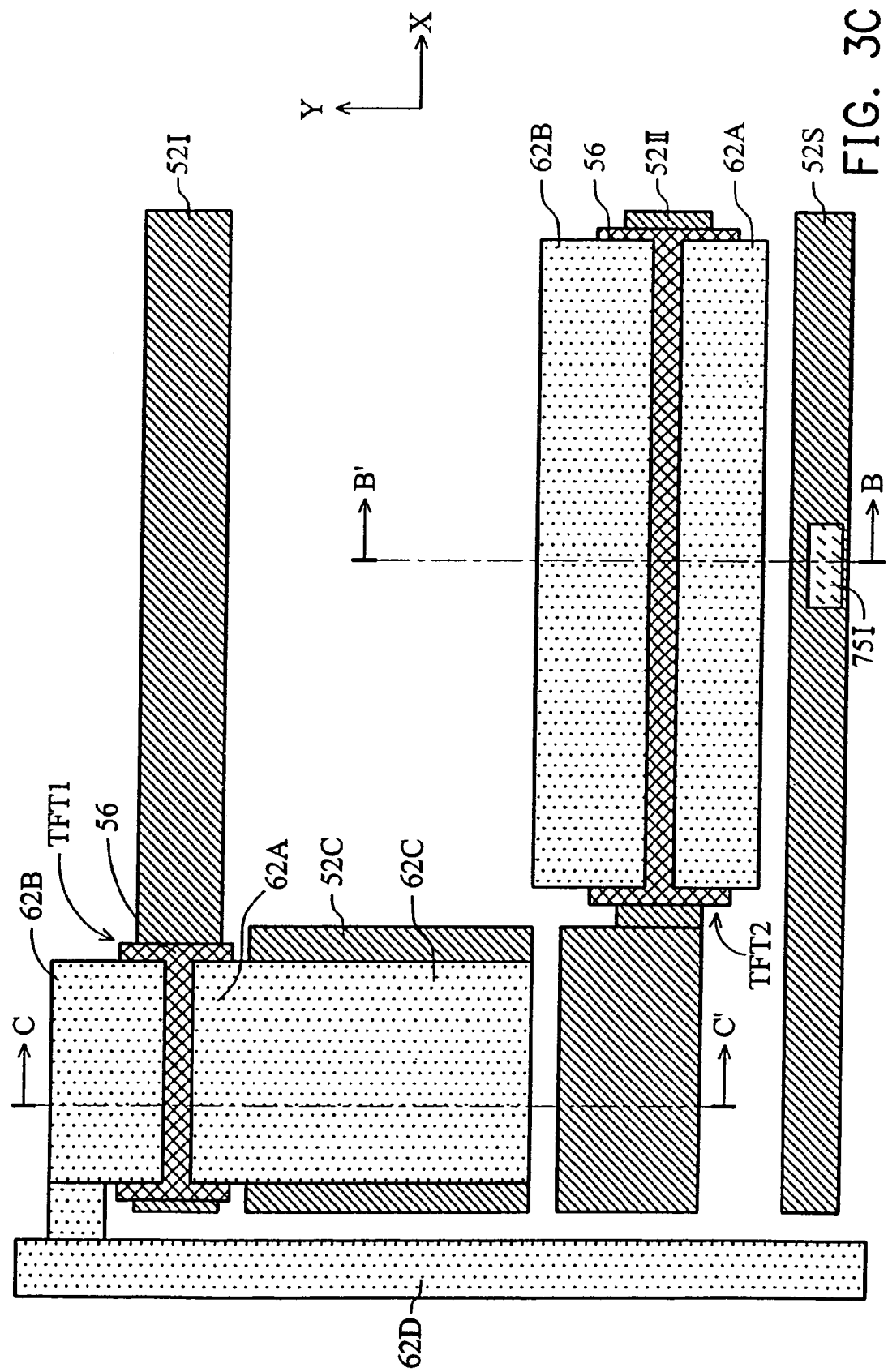

As shown in FIGS. 3C, 4C and 5C, a doped amorphous silicon layer 60 and a second metal layer 62 are successively deposited on the entire surface of the transparent substrate 50, in which an n$^+$-doped polysilicon material is preferred to form the doped amorphous silicon layer 60. Then, using photolithography and etching to remove parts of the doped amorphous silicon layer 60 and the second metal layer 62, the second metal layer 62 is patterned as a data line 62D extending along the Y direction and an upper electrode 62C of the capacitor. It is noted that the doped amorphous silicon layer 60 and the second metal layer 62 remain on the island structure, and completely removed from the source line 52S. Next, using photolithography and etching to form two openings 63I and 63II respectively on the predetermined area of the gate electrodes in the two island structures, the second metal layer 62 is separated as a source/drain electrode 62A/62B, the doped amorphous silicon layer 60 is separated as a source/drain diffusion region 60A/60B, and the amorphous silicon layer 56 serves as a channel region. This completes the first a-Si:H TFT (TFT1) and the second a-Si:H TFT (TFT2).

Figure 4D:
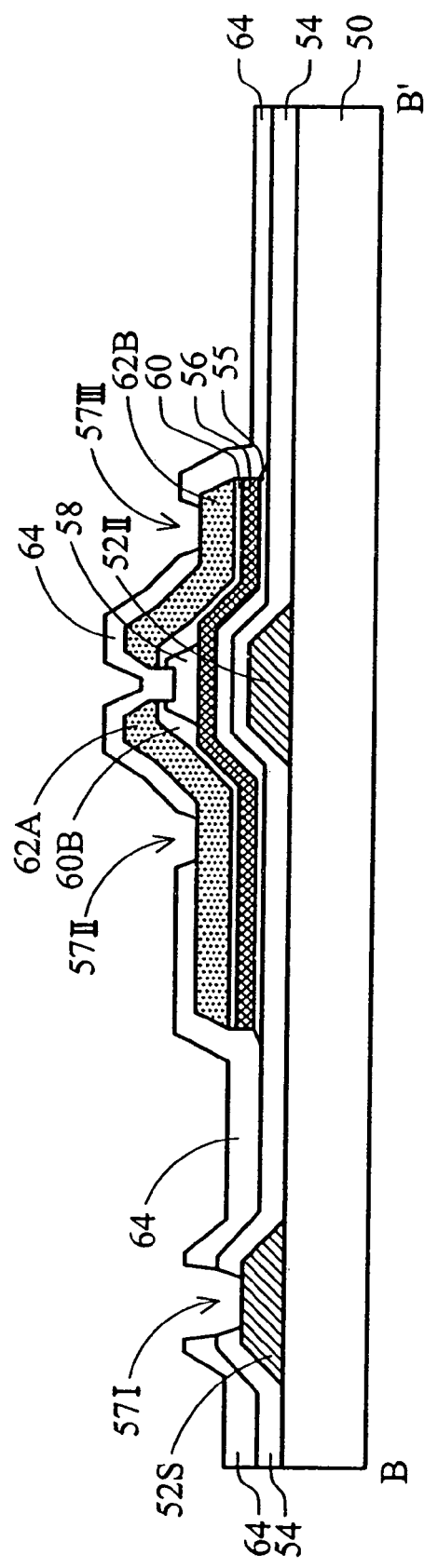

As shown in FIGS. 3D, 4D and 5D, a protection layer 64 is deposited on the entire surface of the transparent substrate 50, and then at least a second via 57II, a third via 57III, a fourth via 57IV and a fifth via 57V are formed in the protection layer 64 by photolithography and etching. Meanwhile, the first via 57I is exposed. The second via 57II and the third via 57III expose the second metal layer 62 in the vicinity of the source/drain electrodes 62A/62B of the second a-Si:H TFT (TFT2). The fourth via 57IV exposes one end of the second scanning line 52I, and the fifth via 57V exposes a part of the upper electrode 62C of the capacitor.

Figure 3E:
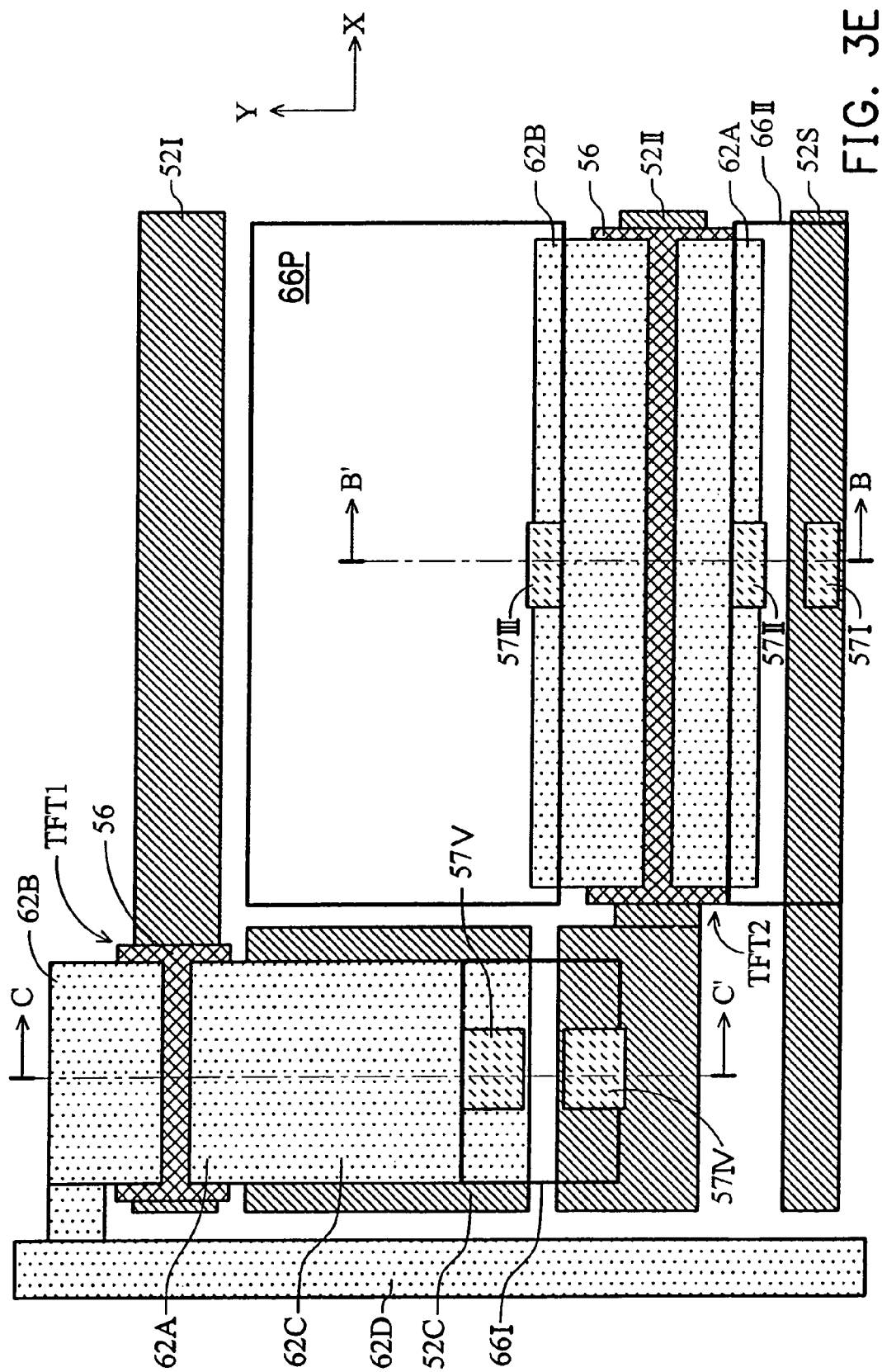
Figure 5E:
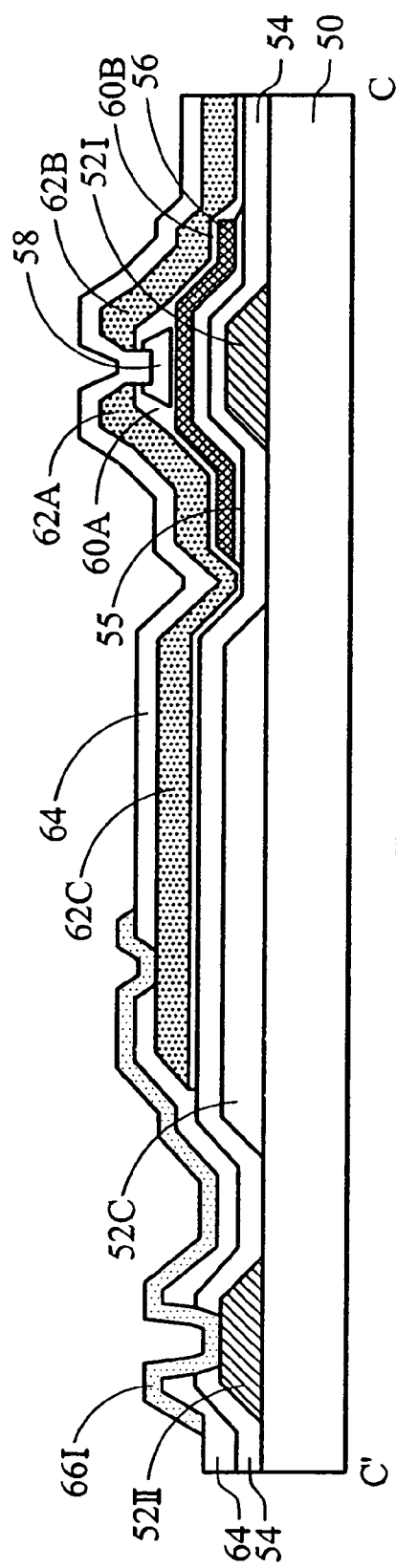

As shown in FIGS. 3E, 4E and 5E, a first transparent-conductive layer 66 of ITO is deposited on the entire surface of the transparent substrate 50, and then patterned as a rectangular display area 66P, and two electrical-connecting bridges 66I and 66II that cover the exposed areas of the vias 57I, 57II, 57III, 57IV and 57V. The first electrical-connecting bridge 66I electrically connects the upper electrode 62C of the capacitor and the second scanning line 52II, and the second electrical-connecting bridge 66II electrically connects the SOURCE LINE 52S and the second scanning line 52II.

Figure 3F:
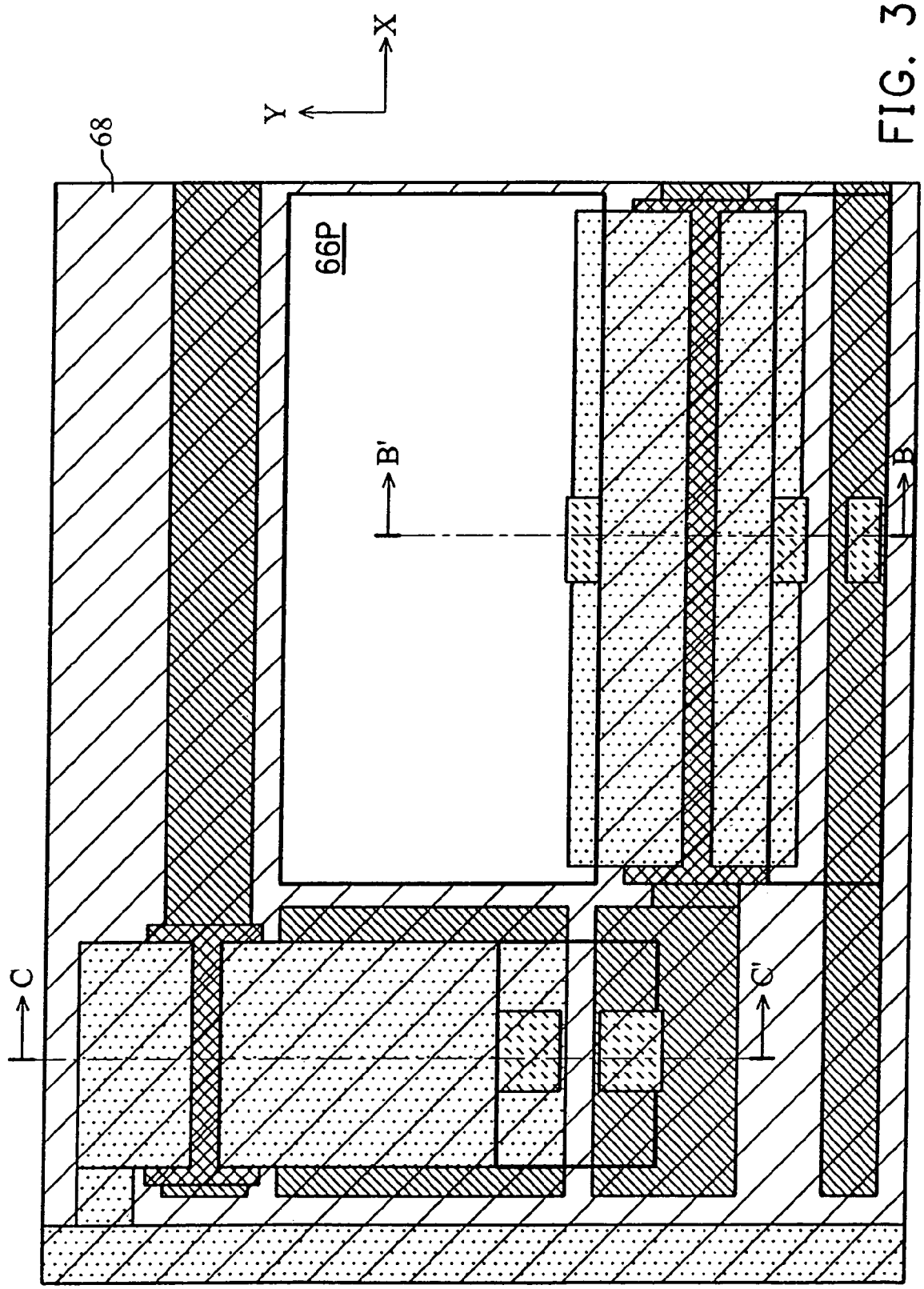
Figure 5F:
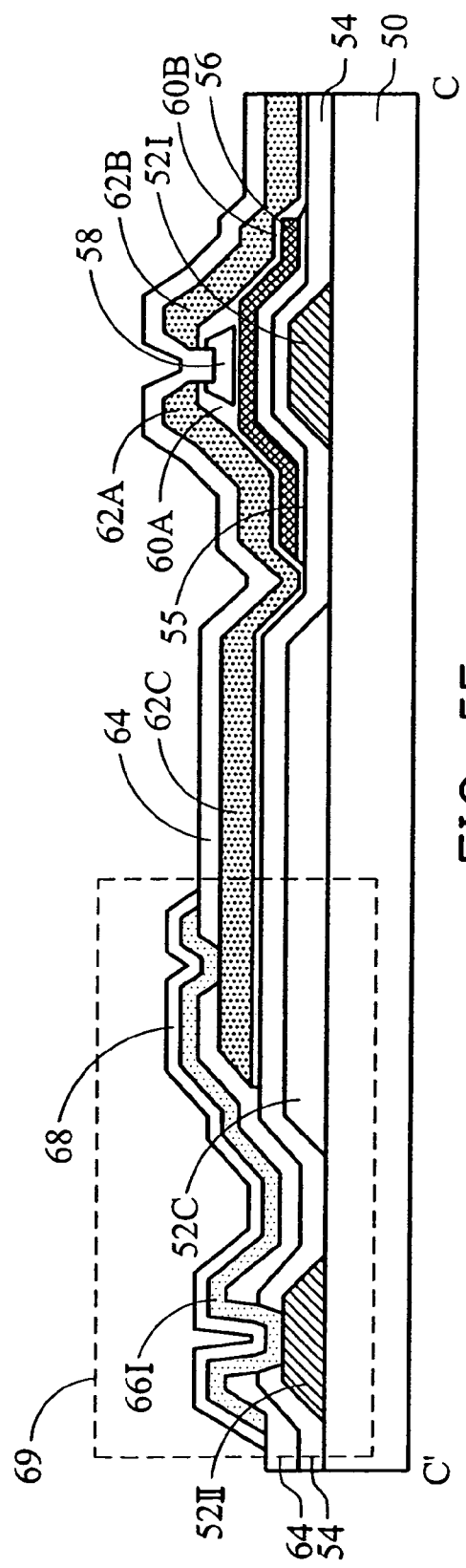

As shown in FIGS. 3F, 4F and 5F, a light-shielding layer 68 is formed on the transparent substrate 50 to cover, at least, the two electrical-connecting bridges 66I and 66II and expose the display area 66P. Thus, the light-shielding layer 68 shields the amorphous silicon layer 56 and isolates a parasitic OLED area 69. To simplify the process, the light-shielding layer 68 is patterned to cover any area outside the display area 66. Preferably, the light-shielding layer 68 is an opaque and insulating single-layered material (such as CrO$_x$), a polymer/resin-containing and double-layered material (such as polyimide/carbon), or an opaque and metallic double-layered material (such as SiO$_x$/Cr).

Figure 4G:
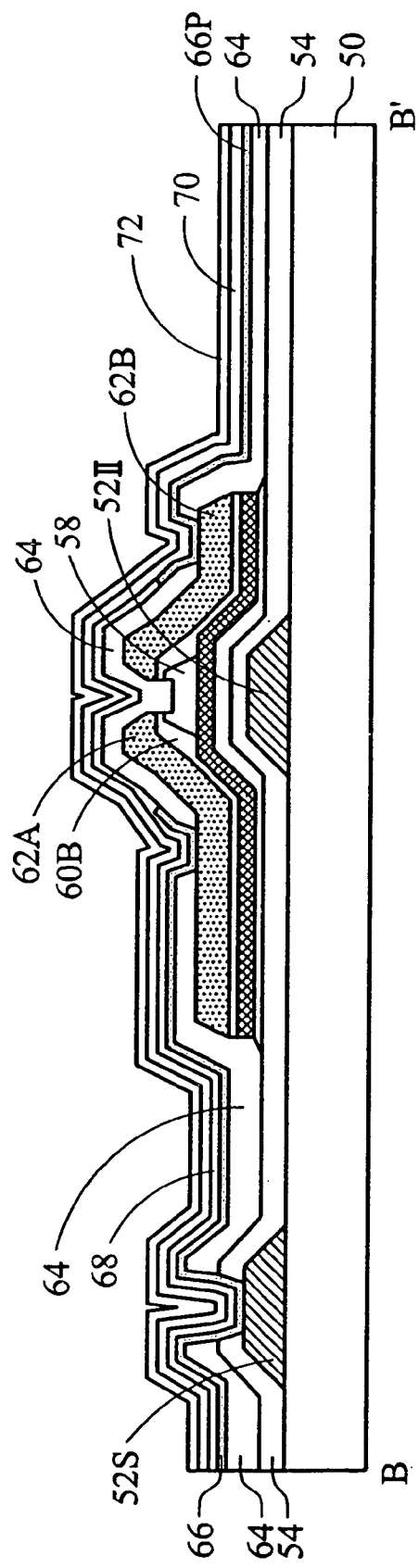
Figure 5G:
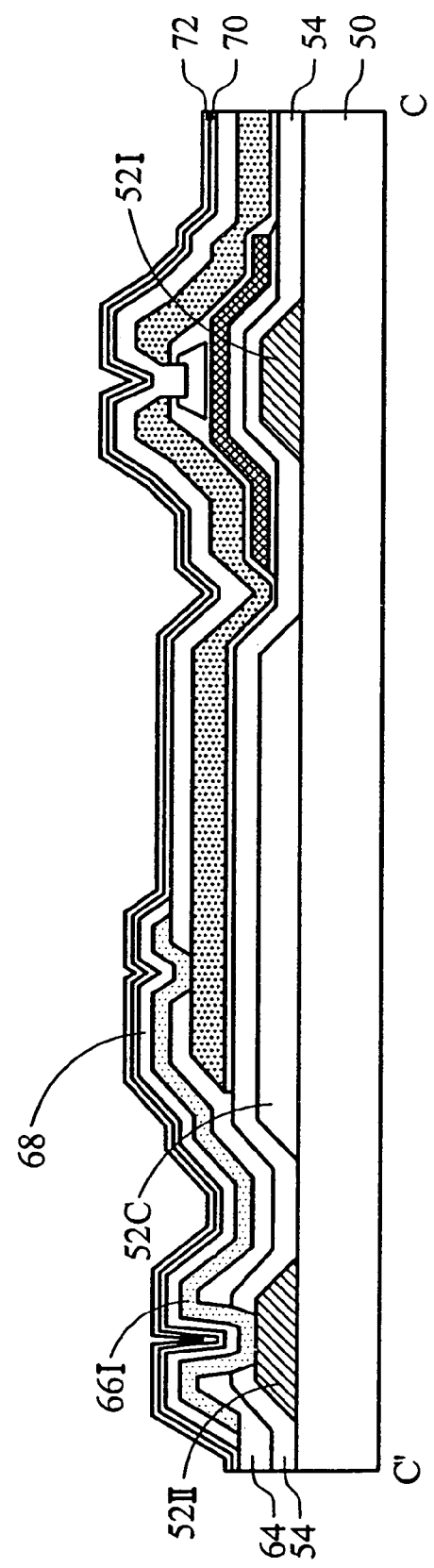

Finally, as shown in FIGS. 4G and 5G, the surface is processed by a rinsing process with UV/O$_3$ or O$_2$ plasma, and then an organic/polymer luminescent layer 70 and a cathode metal layer 72 are successively deposited on the entire surface by a vapor deposition. This completes the AM-OLED process.

Compared with the prior art, the present invention provides the light-shielding layer 68 outside the display area 66P, preventing damage to the amorphous silicon layer 56 from UV light or plasma in the sequential rinsing process, decreasing the threshold voltage and the leakage current caused by the damage to the amorphous silicon layer 56. Also, because the light-shielding layer 68 covers the electrical-connecting bridges 66I and 66II to isolate the parasitic OLED area 69, unnecessary power consumption and visual interference caused by the luminescence of the parasitic OLED are prevented.

It is to be understood that the present invention is not limited to the embodiments described above, but encompasses any and all embodiments within the scope of the following claims.

The invention claimed is:

1. An active matrix organic light emitting display (AM-OLED) comprising a plurality of pixel areas arranged in a matrix form, each pixel area comprising:
   at least two amorphous silicon TFTs, in which the amorphous silicon TFT comprises an amorphous silicon layer serving as a channel region;
   a display area formed by a transparent-conductive layer; and
   a light-shielding layer which covers at least the amorphous silicon layer of the amorphous silicon TFT and exposes the display area.

2. The active matrix organic light emitting display (AM-OLED) according to claim 1, wherein the light-shielding layer is of an opaque and insulating material.

3. The active matrix organic light emitting display (AM-OLED) according to claim 1, wherein the light-shielding layer is a CrO$_x$ single-layered material, a polyimide/carbon double-layered material, or a SiO$_x$/Cr double-layered material.

4. The active matrix organic light emitting display (AM-OLED) according to claim 1, wherein the light-shielding layer covers any area outside the display area.

5. The active matrix organic light emitting display (AM-OLED) according to claim 1, wherein the light-shielding layer covers the transparent-conductive layer outside the display area.

6. The active matrix organic light emitting display (AM-OLED) according to claim 1, wherein the transparent-conductive layer is ITO (indium tin oxide) or IZO (indium zinc oxide).

7. The active matrix organic light emitting display (AM-OLED) according to claim 1, wherein each pixel area is defined by orthogonal intersections between two adjacent data lines and two adjacent source lines, and each pixel area comprises at least one capacitor.

8. The active matrix organic light emitting display (AM-OLED) according to claim 1, wherein the surface of each pixel area is covered with an organic luminescent layer and a cathode metal layer.

* * * * *